United States Patent [19]

Peterson

[11] Patent Number: 4,535,455
[45] Date of Patent: Aug. 13, 1985

[54] CORRECTION AND MONITORING OF TRANSIENT ERRORS IN A MEMORY SYSTEM

[75] Inventor: Donald W. Peterson, Yorkville, Ill.

[73] Assignee: AT&T Bell Laboratories, Murray Hill, N.J.

[21] Appl. No.: 474,447

[22] Filed: Mar. 11, 1983

[51] Int. Cl.³ .................. G06F 11/10; G11C 29/00
[52] U.S. Cl. ........................................ 371/13; 371/38
[58] Field of Search ........................... 371/13, 38, 5

[56] References Cited

U.S. PATENT DOCUMENTS

| | | | |
|---|---|---|---|
| 4,183,463 | 1/1980 | Kemmetmueller | 371/50 |
| 4,216,541 | 8/1980 | Clover et al. | 371/38 |
| 4,296,494 | 10/1981 | Ishikawa et al. | 371/13 |
| 4,319,356 | 3/1982 | Kocol et al. | 371/38 |
| 4,359,771 | 11/1982 | Johnson et al. | 371/13 |
| 4,360,915 | 11/1982 | Sindelar | 371/13 |
| 4,369,510 | 1/1983 | Johnson et al. | 371/13 |
| 4,371,930 | 2/1983 | Kim | 371/13 X |
| 4,380,812 | 4/1983 | Ziegler, II et al. | 371/38 |
| 4,458,349 | 7/1984 | Aichelmann, Jr. et al. | 371/13 |

OTHER PUBLICATIONS

"Dynamic-RAM Controller Times, Refreshes, Arbitrates, and Scrubs", *Electronics*, May 5, 1982, pp. 172, 174.

Primary Examiner—Charles E. Atkinson
Attorney, Agent, or Firm—John C. Moran

[57] ABSTRACT

A microcomputer system in which transient errors occurring in a memory are corrected and logged by a program controlled microprocessor and a simple error detection and correction circuit. When an error occurs in information readout of a memory location, the error detection and correction circuit is responsive to the error to (1) store the address of memory block containing the location, (2) store the type of error, and (3) generate an error signal which interrupts the microprocessor. In response to the interrupt, the microprocessor enters an interrupt routine to: (1) identify the block of memory locations in which the error occurred, (2) determine the type of error, (3) reaccess each memory location of the memory block to effect a rereading thereof, (4) receive each word of readout information, corrected if necessary by the error detection and correction circuit, (5) rewrite each of the received words back into the memory at the proper reaccessed memory location, (6) read out each of the rewritten locations to determine if any error is still present which would indicate a permanent rather than a transient error, and (7) finally, log the error in an error rate table if it is a transient error.

20 Claims, 3 Drawing Figures

| | FIELD 301 | FIELD 302 | FIELD 303 | FIELD 304 |
|---|---|---|---|---|
| WORD 0 | | | | |
| WORD 1 | | | | |
| ⋮ | | | | |
| WORD 127 | | | | |

RAM ERROR TABLE

FIG. 3

CORRECTION AND MONITORING OF TRANSIENT ERRORS IN A MEMORY SYSTEM

TECHNICAL FIELD

This invention relates to a method and error correction facilities for maintaining the integrity of data stored in a memory system. In particular, the method and error correction facilities provide for the rewriting of corrected data words back into the memory system under program control.

BACKGROUND OF THE INVENTION

Innovations rapidly occur in integrated circuit structures of memory systems and in the information storage capacity of, for example, each dynamic random access memory (RAM) in those systems. With such innovations, greater demands are made for improved memory system integrity and reliability.

Transient single bit errors in dynamic RAMs occasionally impair memory system integrity and reliability. Such errors often result in the dynamic corrupting of a single stored bit of information and require the use of complex and costly error detection and correction circuitry, as well as, many real time processor operations to correct the error before it causes performance failures. Another deficiency in such prior art arrangements is the absence of facilities to perform maintenance functions which allow the identification of dynamic RAMs prone to transient errors due to manufacturing or design defects.

SUMMARY OF THE INVENTION

In an illustrated method and structured embodiment, the departure in the art is achieved by correcting and logging transient errors which occur in a memory system by utilizing a program controlled microprocessor and simple error correction and detection circuitry. An important attribute is the correction of transient errors using a minimum of additional microprocessor real-time operations over that required to perform the error logging function. The error logging function allows for the accurate and efficient identification of dynamic RAMs prone to having an excessive number of transient errors.

The illustrative embodiment detects and corrects transient errors in the following manner. The detection circuit is responsive to an accessed memory location containing an error to transmit an error signal to the microprocessor. A significant feature of the invention is that at some later point in time the microprocessor is responsive to the error signal and program instructions which are stored in the memory system to generate address bits for reaccessing that memory location, and it is at this time that the contents of the accessed memory location are corrected in the following manner. The error correction circuit is operative following the reaccessing of the accessed memory location to correct the latter's contents before transmission to the microprocessor. The microprocessor is responsive to a subset of the program instructions and the corrected contents to rewrite the corrected contents back into the accessed memory location. After writing the corrected contents back into the accessed memory location, the microprocessor is responsive to the address of the memory location and another subset of the program instructions to update an error rate table stored in the memory system.

To further reduce the amount of circuitry for implementing the detection function, the memory system is divided into memory blocks, and an address storage circuit is responsive to the error signal to store address bits defining the block of memory locations in which the error occurred. The microprocessor is responsive to the error signal to read the stored address bits and to reaccess each memory location in the block of memory locations. As each memory location is accessed, the error correction circuit corrects the accessed contents, if necessary, and the microprocessor rewrites those contents back into the accessed memory location. This process continues until all the memory locations of the memory block have been reaccessed.

The error detection circuit is responsive to each memory location accessed from the memory system to determine not only that an error has occurred but also to determine the type of error and to store error type signals representing the error. After reaccessing and rewriting each memory location of the memory block, the microprocessor performs a check to determine whether the error was a transient or permanent error. It does so by again reaccessing each memory location of the memory block thereafter reading the stored error type signals to detect whether or not the error still exists within the memory block. If no error exists, the previous detected error was a transient error. On the other hand if an error exists, the conclusion is that the previous detected error is a permanent error which is still present in the memory block and appropriate maintenance routines are executed.

The microprocessor performs the previously defined functions by executing sets of program instructions. The program instructions are stored in the memory system, and the microprocessor is responsive to the error signal to commence execution of these sets of instructions.

In addition, the communication between the detection circuit and the microprocessor is improved by the microprocessor having an interrupt circuit responsive to the error signal to interrupt the microprocessor and force it to execute the program instructions for the foregoing error correction operations.

Advantageously, the error rate table is organized in such a manner as to allow the accurate and efficient identification of dynamic RAMs prone to having an excessive number of transient errors. Each dynamic RAM comprises a plurality of storage arrays each having rows and columns. Experience has shown that the monitoring of transient errors occurring on a per row basis allows the optimal identification of error prone RAMs. The monitoring commmprises the functions of logging the transient errors as they occur and verifying that a maximum error rate has not been exceeded. The error rate table has one memory field associated with each row contained in each RAM. The logging function is performed by the microprocessor responding to program instructions to not only determine which RAM has failed, but also to determine the row within that RAM. Next, the microprocessor records the occurrence of the error by incrementing the field associated with that row. Then, the microprocessor verifies that the field has not exceeded a predetermined number which would indicate that the maximum error rate had been exceeded.

In order to facilitate the calculation of the error rate, the microprocessor further comprises an interval timer which generates a timing signal to the interrupt structure of the microprocessor at predetermined time intervals for periodic decrementing each field in the error rate table. The microprocessor is responsive to the resulting interrupt from the interval timer to execute a set of program instructions which decrement by "1" the contents of each of the memory fields which is greater than "0".

The novel method efficiently and economically corrects and logs transient errors occurring in a memory system utilizing a microprocessor and simple error correction and detection circuitry. The method involves the steps of: storing the address of the memory block in which an error occurred during the accessing of the memory system, interrupting the operation of the microprocessor, reading the stored address, reaccessing the memory locations of the memory block identified by the real address, correcting the contents of each memory location, rewriting the corrected contents into the proper memory locations, rereading each memory location to determine if an error is still present which would indicate that the original error was a permanent error, and logging the occurrence of the error in an error rate table.

BRIEF DESCRIPTION OF THE DRAWING

FIG. 3 shows the memory layout of a RAM error table used by the microprocessor of FIG. 1.

DETAILED DESCRIPTION

Figure 1:
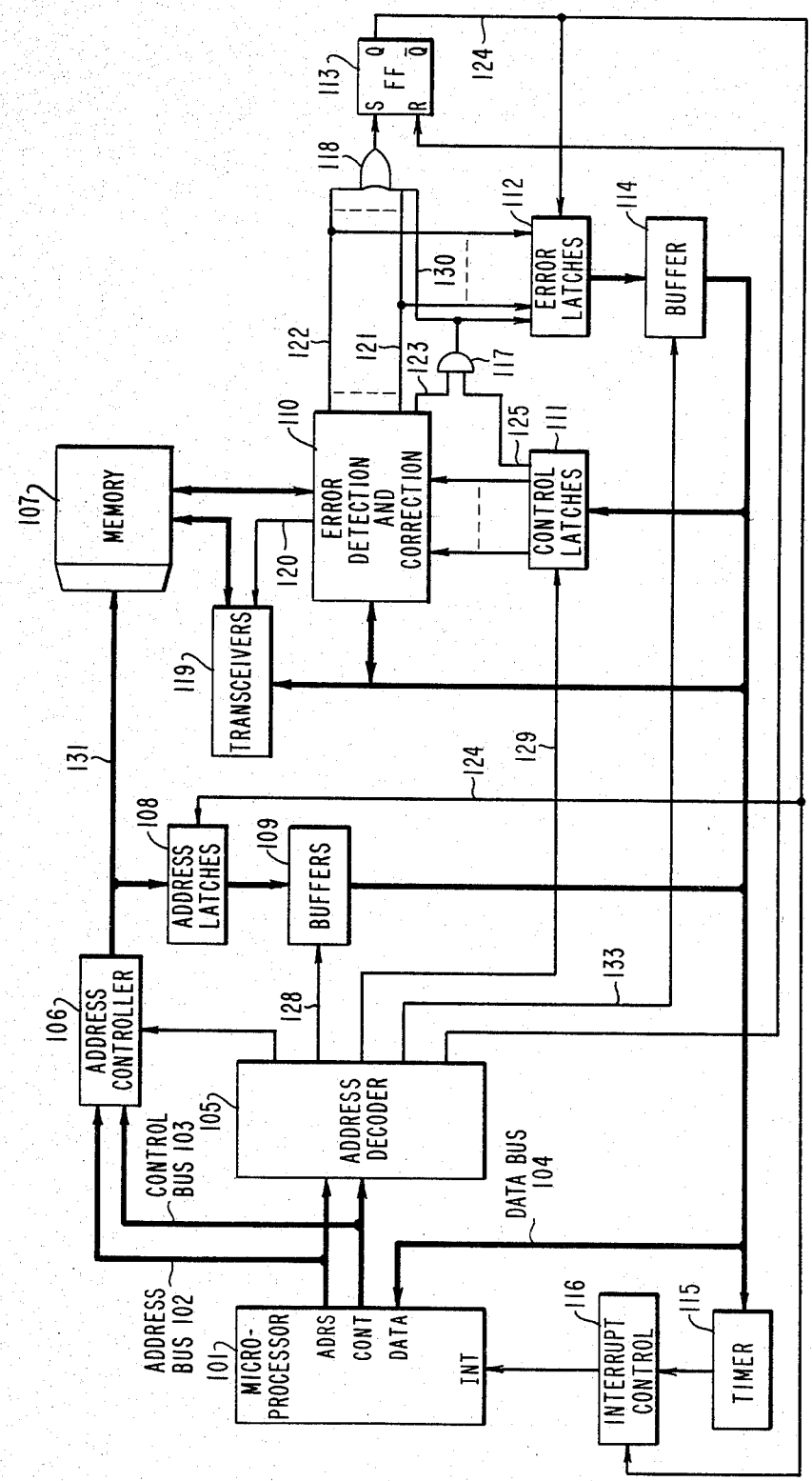
FIG. 1 shows, in block diagram form, a program controlled microprocessor and error correction and detection circuitry for correcting transient errors occurring in a memory in accordance with the present invention.

In the arrangement of FIG. 1, a program controlled microprocessor 101 cooperates with memory address controller 106 to effect a reading of memory 107 at memory locations defined by addresses supplied via address bus 102 by microprocessor 101. If no error is present in the read out information, that information is sent via transceivers 119 and data bus 104 to microprocessor 101 to allow it to proceed with its next functional operation.

Errors in the information read out of memory 107 are detected by an error detection and correction circuit 110. On such a detection, circuit 110 via conductor 120 disables the transceivers 119 from sending the read out information via data bus 104 to microprocessor 101. Instead, circuit 110 corrects the readout information and transmits the corrected information to microprocessor 101 via data bus 104. At about the same time, circuit 110 identifies the type of error by applying signals to conductors 121 and 123. Those signals activate gate 118 to effect the setting of flip-flop 113 and the transmission of a signal from its "Q" output via conductor 124 to: (1) enable error latches 112 to be responsive to the signals on conductors 121 and 123 for storing the type of error, (2) enable address latches 108 to be responsive to address bit signals on bus 131 for storing the address of the accessed memory location of memory 107 in which the error arose, and (3) concurrently activating interrupt control 116 to interrupt the program being executed by microprocessor 101.

In response to the interrupt, microprocessor 101 enters an interrupt routine to: (1) identify the block of memory locations in which the error occurred, (2) determine the type of error, (3) reaccess each memory location of the memory block to effect a rereading thereof, (4) receive each word of readout information, corrected if necessary by circuit 110, (5) rewrite each of the received words back into memory 107 at the proper reaccessed memory location, (6) read out each of the rewritten locations to determine if any error is still present which would indicate a permanent rather than transient error, and (7) finally, log the error in an error rate table if it is a transient error.

Figure 2:
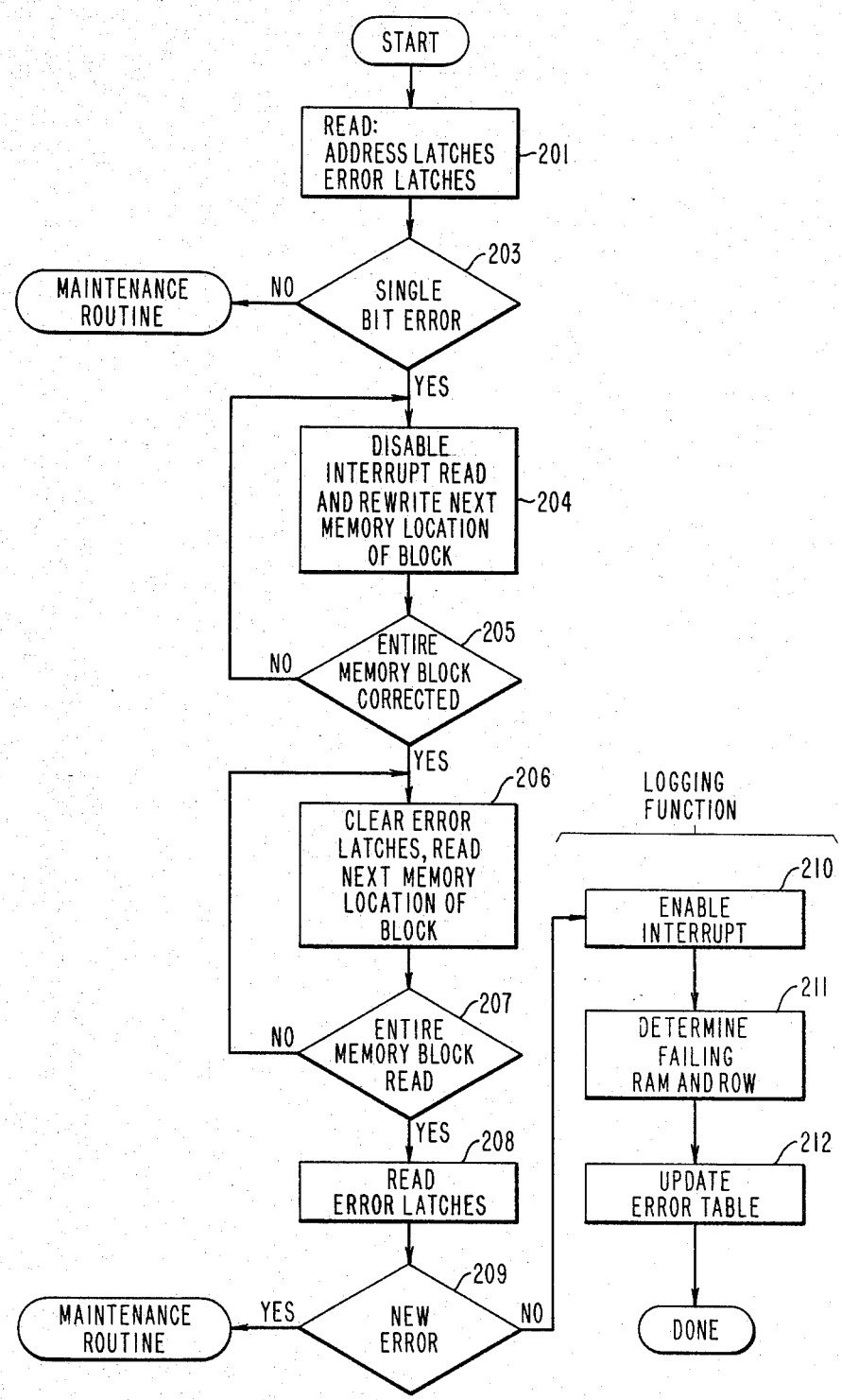
FIG. 2 is a flow chart of the program operations for implementing the error detection and correction functions of the structure of FIG. 1.

Microprocessor 101 performs the previous functions by executing sets of program instructions upon entering the interrupt routine. These program instructions are stored in memory 107 and are accessed by microprocessor 101 transmitting address signals via address bus 102 and a read request signal via control bus 103. The entire interrupt routine which comprises these sets of program instructions is illustrated by the flowchart of FIG. 2. Microprocessor 101 determines the identity of the memory block by executing a first set of programmed instructions as illustrated by block 201 of FIG. 2. The determination of the error type is performed by executing a second set of programmed instructions illustrated by blocks 201 and 203 of FIG. 2. Microprocessor 101 reaccesses and rewrites each word of the identified memory block by executing a third and a fourth set of programmed instructions, respectively, as illustrated by blocks 204 and 205 of FIG. 2. This rereading and rewriting of each word in the identified memory block assures that a transient error will be corrected since the contents of each reaccessed memory location of the memory block will be corrected by circuit 110 before transmission to microprocessor 101. After each memory location has been rewritten, microprocessor 101 determines whether or not the error was a permanent or a transient error by first executing a fifth set of program instructions as illustrated by blocks 206 and 207 of FIG. 2. After rereading each memory location, microprocessor 101 executes a sixth set of program instructions which read the contents of error latches 112 and then determines whether or not an error had occurred based on the contents of error latches 112 as illustrated in blocks 208 and 209 of FIG. 2. If no error occurred during the rereading of the memory block, then the original error was a transient error and must be logged in the error rate table. Microprocessor 101 logs the occurrence of a transient error in the error rate table by executing a seventh set of programmed instructions as illustrated by blocks 210 through 212 of FIG. 2. The logging activity involves maintaining an error rate table comprising fields with each field associated with a fixed number of memory locations. Once an error has occurred, the logging activity identifies the field associated with the memory location containing the error and properly updates the identified field.

Considering these operations now in greater detail with reference to FIG. 2, microprocessor 101 reads a word from memory 107 by transmitting 18 address bits via address bus 102 designating the desired word and transmitting a read request signal via control bus 103. Address decoder 105 is responsive to the address bits and the read request signal to enable address controller 106 which in turn actuates memory 107 to access the desired word. Each memory word in memory 107 contains 16 data bits and 6 error correction bits. The error correction bits are transmitted to circuit 110 and the data bits are transmitted through transceivers 119 to data bus 104. Microprocessor 101 does not act on the data present on bus 104 until sufficient time has lapsed for circuit 110 to perform the following actions. Circuit 110 is responsive to the error correction and data bits to detect and correct single bit errors occurring in the accessed memory location. After the data is transmitted through transceivers 119, circuit 110 internally latches this data and performs the necessary correction and detection. If it is necessary to correct the accessed data, circuit 110 disables transceivers 119 from transmitting on bus 104 by the transmission of a signal via conductor 120. After transceivers 119 have been disabled, circuit 110 transmits the corrected data via data bus 104, to microprocessor 101 which then reads the corrected data from data bus 104.

If circuit 110 detects and corrects an error in the data read from memory 107, it also stores the type of error in error latches 112. This storage is initiated by circuit 110 transmitting signals via conductors 121 through 123. OR gate 118 is responsive to the transmission of any signal on conductors 121 through 123 to set flip-flop 113. The setting of flip-flop 113 causes the signals transmitted on conductors 121 through 123 to be stored in error latches 112 and the 16 most significant address bits (on bus 131) of the accessed memory location to be stored in address latches 108 by latches 112 and 108 responding to a signal transmitted via conductor 124 from the "Q" output of flip-flop 113. The stored 16 most significant address bits define the address of a block of four memory locations. One of the memory locations is the location containing the error. In addition, the setting of flip-flop 113 causes an interrupt to microprocessor 101 via conductor 124 and interrupt control 116.

Microprocessor 101 is responsive to the interrupt to start execution of the program shown in flowchart form in FIG. 2. Microprocessor 101 must first determine the type of error by reading the contents of the error latches 112 as illustrated in block 201 of FIG. 2. This reading is performed by transmitting the appropriate address via address bus 102 and transmitting a read request signal via control bus 103. Address decoder 105 decodes the information on buses 102 and 103 and enables buffer 114 via conductor 133 to transmit the contents of error latches 112 to microprocessor 101 via data bus 104. Microprocessor 101 then reads the transmitted information from bus 104. Microprocessor 101 similarly cooperates with address controller 106, buffers 109, and conductor 128 to effect the reading of address latches 108.

After reading the address and error latches, microprocessor 101 executes instructions illustrated by blocks 203 through 205 of FIG. 2 to perform the following operations. Microprocessor 101 utilizes the address contents of latches 108 to read the first word in the memory block by executing a read instruction. During the read instruction, the accessed word is read from memory 107 under control of address controller 106; and, if necessary, the word is corrected by circuit 110 as previously described. After microprocessor 101 receives the accessed word via bus 104, it rewrites this word back into memory 107 in a known manner. Microprocessor 101 reads and writes each of the remaining three words in the memory block in this manner.

Before performing the above operation, microprocessor 101 disables the single bit error signal generated by circuit 110 so that microprocessor 101 does not receive an interrupt during the execution of the read and write instructions. This disabling is accomplished by writing a "0" into the bit position in control latches 111 that controls the state of conductor 125, causing a "0" to be transmitted via the latter. A "0" being transmitted via conductor 125 disables AND gate 117, inhibiting the transmission of the single bit error signal via conductor 130. Hence, the single bit error signal cannot set flip-flop 113 via OR gate 118.

Other bit positions in control latches 111 control the functions performed by circuit 110. The states of these other bit positions are not changed during the previous operation. Microprocessor 101 maintains in memory 107 a control memory location whose contents reflect the state of all of the bit positions of latches 111. To modify only one bit position in latches 111, microprocessor 101 reads the control memory location, modifies the desired bit position of the read contents, and writes the modified contents into the control memory location and latches 111. Microprocessor 101 writes information into control latches 111 by transmitting address bits via address bus 102 designating control latches 111, data bits via data bus 104, and a write request signal via control bus 103. Address decoder 105 is responsive to the address bits and the write request signal to transmit an enable signal to the control latches 111 via conductor 129. Control latches 111 are responsive to the enable signal to read and store the transmitted information from bus 104.

After performing the rewriting of the memory block and once again enabling the single bit error signal, microprocessor 101 executes blocks 206 through 209 of FIG. 2. Microprocessor 101 enables the single bit error by writing a "1" into the bit position of control latches 111 controlling conductor 125. After enabling the single bit error signal, microprocessor 101 rereads each memory location of the memory block. After reading all of the memory locations, microprocessor 101 then reads the error latches 112 via buffer 114 to verify whether or not an error occurred. If no error had occurred, microprocessor 101 logs the fact that a transient error had previously occurred by executing a subroutine of the statistical error monitoring routine which is illustrated by blocks 210 through 212 of FIG. 2. If an error occurs during the rereading of the memory block, then this indicates that the failing memory location has permanently failed, and the appropriate maintenance functions must be initiated.

The statistical error monitoring routine performs two distinct functions. As illustrated by blocks 210 through 212 of FIG. 2, the first of these functions is to log the transient errors as they occur and verify that during the logging procedure the maximum error rate has not been exceeded. The second function of the statistical error monitoring routine is to periodically subtract a one from each of the error fields. If the rate at which errors are occurring exceeds the rate at which the subtraction by one is taking place then the error rate has exceeded the predetermined rate. The latter is adjusted by adjusting the periodic rate of subtraction. The logging algorithm is based on the internal structure of the dynamic RAM integrated circuits.

Memory 107 comprises dynamic RAM integrated circuits which are externally configured as a 65,736 by 1 memory device. Internally these dynamic RAMs are structured as four 128 by 128 arrays of storage elements. Because of the internal design of the RAMs, transient failures are often localized to particular rows. For maintenance reasons it is desirable to not only pinpoint that a particular RAM has an excessive number of transient errors but also to be able to identify each particular row in an array which is contributing to the excessive number of transient errors.

Each RAM has an associated RAM error table stored in memory 107 as illustrated in FIG. 3. Each memory word of the RAM error table has four fields and each field is associated with a particular row of one of the storage arrays. For example, memory word "0" contains field 301 through 304 associated with the first rows of the first, second, third, and fourth storage arrays, respectively. After microprocessor 101 has corrected the transient error in memory 107, microprocessor 101 examines the address of the corrected word to determine the memory word and field in the RAM error table which is associated with the row in which the failure occurred. Microprocessor 101 then reads the associated field, checks to make sure that the error contents of the field are not greater than the maximum allowable number of errors and increments the field by one. If the field would exceed the maximum number upon being incremented, microprocessor 101 initiates the appropriate maintenance routine since the transient error rate has exceeded the allowable number.

The second function of the statistical error monitoring routine is to implement error rate monitoring. This routine is controlled by timer 115 whose time-out interval is set by microprocessor 101 during initialization and as required during system operation. Periodically, timer 115 causes an interrupt to microprocessor 101 via interrupt control 116. In response to the interrupt from timer 115, microprocessor 101 executes a routine which subtracts one from all the fields of the RAM error table which are greater than "0". The periodic decrementing of each field of the RAM error table assures that the error rate of any particular row within a dynamic RAM exceeds a predetermined rate before any maintenance functions are executed.

It is to be understood that the above-described embodiment is merely illustrative of the principles of this invention; other arrangements may be devised by those skilled in the art without departing from the spirit and scope of the invention.

What is claimed is:

1. An arrangement for correcting and monitoring errors occurring in memory means having a plurality of memory locations, comprising
    means for detecting an occurrence of one of said errors in an accessed memory location of said memory;
    generating means responsive to the occurrence of one of said errors for generating an error signal;
    processor means responsive to said error signal and a first set of program instructions to generate a set of signals for reaccessing said accessed memory location;
    means for correcting the reaccessed contents of said accessed memory location;
    said processor means being further responsive to a second set of program instructions and the corrected reaccessed contents for rewriting the latter into said accessed memory location; and
    said processor means being further responsive to said reaccessed corrected contents and a third set of program instructions for updating an error rate table stored in said memory means.

2. The arrangement of claim 1 wherein said memory means comprises blocks of said memory locations and said arrangement further comprises means responsive to said error signal for storing address signals identifying the block of memory locations containing said accessed memory location;
    said first set of program instructions further comprises a first subset of program instructions;
    said processor means being responsive to said error signal, the stored address signals and said first subset of program instructions to generate a plurality of subsets of said set of signals for reaccessing each memory location in the identified block;
    said correcting means being further responsive to each of said reaccessed memory locations of said identified memory block for correcting the reaccessed contents of each memory location of said identified memory block reaccessed by said processor means;
    said second set of program instructions comprises a second subset of program instructions; and
    said processor means being responsive to said second subset of program instructions for rewriting the corrected reaccessed contents of each of said memory locations of said identified memory block back into the latter.

3. The arrangement of claim 2 wherein each of said memory locations contains data and error bit signals and said correcting means being responsive to said error bit signals for Hamming error correcting the reaccessed contents of each of said reaccessed memory locations of said identified memory block.

4. The arrangement of claim 1 wherein said generating means comprises means for generating signals indicating the type of error which occurred in said accessed memory location and means for storing the error type signals;
    said first set of program instructions comprises a first subset of program instructions and a second subset of program instructions;
    said processor means being further responsive to said error signal and said first subset of program instructions for reading said error type signals from said storage means; and
    processor means being further responsive to said second subset of program instructions and said error type signals to determine whether said error signals indicate a single bit error and upon said error type signals indicating said single bit error for executing said second set of program instructions for rewriting said corrected contents into said accessed memory location.

5. The arrangement of claim 1 further comprises interrupt means connected to said generating means and responsive to said error signal to initiate an interrupt operation in said processor means for executing said first set of program instructions;
    said first set of program instructions comprises a subset of program instructions; and
    said processor means being further responsive to said subset of program instructions for disabling said interrupt means thereby inhibiting the execution of another interrupt operation.

6. The arrangement of claim 5 wherein said third set of program instructions comprises another subset of program instructions and said processor means being further responsive to said other subset of program instructions to enable said interrupt means for allowing an initiation of said other interrupt operation.

7. The arrangement of claim 1 wherein said second set of program instructions comprises a subset of program instructions and said processor means being further responsive to said subset of program instructions for reaccessing said accessed memory location after the rewriting of the latter to verify that said one of said errors has been corrected.

8. The arrangement of claim 1 wherein said memory means has dynamic random access integrated circuits each comprising a plurality of storage arrays each having rows and columns;

said error rate table comprises a plurality of memory fields each associated with one row of one of said arrays;

said third set of program instructions comprises a first and a second subset of program instructions; and said processor means being further responsive to said first subset of program instructions for determining in which row of which dynamic random access integrated circuit said one of said errors is contained and being further responsive to said second subset of program instructions and the determination of the row containing said one of said errors for updating the associated field in said error rate table.

9. The arrangement of claim 8 further comprises timer means for generating a timer signal at predetermined time intervals; and said processor means being further responsive to a receipt of said timer signal and a fourth set of program instructions for decrementing the contents of each of said memory fields for assuring that the occurrence of said errors does not exceed an error rate determined by the decrementing.

10. The arrangement of claim 9 further comprises an interrupt circuit responsive to said timer signal for causing said processor means to execute an interrupt operation resulting in said processor means executing said fourth set of program instructions for assuring that said occurrence of said errors does not exceed said error rate.

11. An arrangement for correcting said monitoring errors occurring in memory means having a plurality of memory blocks each memory block comprising a plurality of memory locations, comprising means for detecting an occurrence of one of said errors in an accessed memory location of one of said memory blocks;

generating means responsive to the occurrence of one of said errors for generating an error signal indicative of said occurrence;

processor means responsive to said error signal and a first set of program instructions to generate a plurality of sets of signals for reaccessing each memory location in said one of said memory blocks;

said generating means being further responsive to the reaccessed contents of each of said reaccessed memory locations of said one of said memory blocks for correcting the reaccessed contents of each memory location of said one of said memory blocks;

said processor means being further responsive to a second set of program instructions for rewriting the corrected reaccessed contents back into each of said memory locations of said one of said memory blocks reaccessed by said processor means thereby correcting the contents of each of said memory locations;

said processor means being further responsive to a third set of program instructions for rereading each memory location of said one of said memory blocks to verify that said one of said errors has been corrected; and said processor means being further responsive to a fourth set of program instructions to identify the memory location which had contained said one of said errors for updating an error rate table stored in said memory means for identifying memory elements of said memory means causing an excess number of said errors.

12. The arrangement of claim 11 further comprises means being responsive to said error signal for storing address signals identifying said one of said memory blocks;

said first set of program instructions further comprises a subset of program instructions; and said processor means being further responsive to said error signal and said subset of program instructions to read the address signals stored in said storage means for identifying said one of said memory blocks.

13. The arrangement of claim 11 further comprises interrupt means responsive to said error signal for forcing said processor means to execute an interrupt operation resulting in the execution of said first set of program instructions for reaccessing said memory locations of said one of said memory blocks.

14. The arrangement of claim 11 wherein said memory means comprises dynamic access integrated circuits each having a plurality of storage arrays each comprising rows and columns and said arrangement further comprises timer means for generating a timer signal at predetermined time intervals;

said error rate table comprising a plurality of memory fields each associated with one row of one of said arrays;

said fourth set of program instructions comprising a first and a second subset of program instructions;

said processor means being further responsive to said first subset of program instructions for determining which row of which dynamic random access integrated circuits said one of said errors is located and being further responsive to said second subset of program instructions for updating the associated field in said error rate table; and said processor means being further responsive to said timer signal and a fifth set of program instructions for decrementing the contents of each of said memory fields for assuring that the occurrence of said errors does not exceed a predetermined error rate determined by the decrementing.

15. An arrangement for correcting and monitoring errors occurring in memory means having a plurality of memory blocks each block comprising a plurality of memory locations, comprising processor means for accessing said plurality of memory blocks by the generation of address signals;

means for detecting an occurrence of one of said errors in an accessed memory location of one of said memory blocks;

generating means responsive to said occurrence of one of said errors for generating an error signal indicative of said occurrence and further being responsive to said occurrence for generating error type signals indicating the error type of said one of said errors;

means responsive to said error signal for storing said error type signals;

means responsive to said error signal for storing the address signals identifying said one of said memory blocks;

interrupt means responsive to said error signal for interrupting said processor means;

said processor means being responsive to said interrupting to execute a first set of program instructions for reading the stored address signals;

said processor means being further responsive to second set of program instructions to read the stored error type signals to determine if said one of said errors is a transient error;

said processor means being further responsive to the determination of said one of said errors being a transient error, a third set of program instructions, and the read address signals to generate a plurality of sets of signals for reaccessing each memory location in said one of said memory blocks;

generating means being further responsive to the reaccessed contents of each of said memory locations of said one of said memory blocks for correcting the reaccessed contents of each of said memory locations of said one of said memory blocks;

said processor means being further responsive to a fourth set of program instructions for rewriting the corrected reaccessed contents back into each of said memory locations of said one of said memory blocks thereby correcting the contents of each of said memory locations;

said processor means being further responsive to a fifth set of program instructions for rereading each of the rewritten memory locations of said one of said memory blocks;

said generating means further being responsive to each of said memory locations of said one of said memory blocks reread by said processor means to generate and to store other error type signals for identifying the type of error occurring;

said processing means being further responsive to a sixth set of program instructions for reading the stored other error type signals verifying that said one of said errors has been corrected upon said stored error type signals indicating the absence of the occurrence of another error; and said processor means being further responsive to a seventh set of program instructions to identify the memory location which had contained said one of said errors for updating an error rate table stored in said memory means.

16. An arrangement for controlling the integrity of memory means having a plurality of memory locations, comprising means for detecting an error in readout information from said memory means;

processor means responsive to the detection of an error in readout information for initiating an interrupt operation resulting in the execution of program instructions to reread the one of said memory locations storing said readout information;

means responsive to the rereadout information for correcting the latter for transmission to said processor means;

said processor means being responsive to the corrected transmitted information for rewriting the latter into said one of said memory locations;

said processor means being further responsive to a subset of said program instructions for rereading the rewritten information;

means responsive to the readout rewritten information for generating error type signals representing what type of error occurred in said readout rewritten information; and said processor means being further responsive to another subset of said program instructions and said error type signals for logging the occurrence of a transient error type upon said error signals indicating no error.

17. An arrangement for controlling the integrity of memory means having a plurality of memory blocks each comprises a plurality of memory locations, comprising means for detecting an error in readout information;

means responsive to the detection of an error in readout information for storing address signals identifying one of said memory blocks in which said error occurred;

processor means responsive to said detection of said error for initiating an interrupt operation resulting in the execution of program instructions to reread each memory location of said identified one of said memory blocks;

means responsive to readout information from each of said memory locations of said identified one of said memory blocks for correcting said readout information associated with each memory location of said identified one of said memory blocks before transmission to said processor means;

said processor means being responsive to the corrected transmitted information from each of said read memory locations of said identified one of said memory blocks for rewriting the corrected transmitted information back into each memory location of said identified one or said memory blocks;

said processor means being further responsive to a subset of said program instructions for rereading the rewritten information from each of said memory locations of said identified one of said memory blocks;

means responsive to the readout rewritten information for generating error type signals representing what type of error occurred in said readout rewritten information; and said processor means being further responsive to another subset of said program instructions and said error type signals for logging the occurrence of a transient error upon said error signals indicating no error.

18. A method for correcting and detecting errors occurring in memory means having blocks of memory locations during the accessing of said memory locations by processor means generating addresses, comprising the steps of detecting an error occurring in a memory block defined by an address;

storing said address of said memory block in which said error occurred;

interrupting said processor means in order to correct said error;

reading the stored address by said processor means for identifying said memory block;

reading each memory location of said memory block in response to the read stored address;

correcting the contents of each of said read memory locations upon said contents being in error;

rewriting the corrected contents of each of said read memory locations back into the proper read memory locations;

rereading each memory location of said memory block to determine if said error is still present; and logging the occurrence of said error in an error rate table upon said error no longer existing.

19. The method of claim 18 wherein each of said read memory locations comprises data and error correction bit signals and said correcting step comprises the step of Hamming error correcting the data signals of each of said read memory locations utilizing the error correction bit signals.

20. The method of claim 18 wherein said memory means comprises dynamic random access integrated circuits each comprising a plurality of storage arrays each having rows and columns and said error rate table comprising a plurality of memory fields each associated with one row of one of said arrays, and said logging step comprises the steps of determining in which row of which dynamic random access integrated circuit said error occurred;

incrementing the contents of the field associated with said row;

executing a maintenance routine upon said contents of said field exceeding a predetermined value; and decrementing the contents of each field in said error rate table at predetermined time intervals for establishing an error rate determined by said predetermined time intervals.

* * * * *